(12) United States Patent
Stanbery

(10) Patent No.: US 12,317,634 B1
(45) Date of Patent: May 27, 2025

(54) PHOTOELECTROCHEMICAL PROCESS INTENSIFICATION FOR SUSTAINABLE PHOTOVOLTAICS MANUFACTURING

(71) Applicant: HelioSynergy LLC, Austin, TX (US)

(72) Inventor: Billy Jack Stanbery, Austin, TX (US)

(73) Assignee: HELIOSYNERGY LLC, Austin, TX (US)

( * ) Notice: Subject to any disclaimer, the term of this patent is extended or adjusted under 35 U.S.C. 154(b) by 37 days.

(21) Appl. No.: 18/115,280

(22) Filed: Feb. 28, 2023

Related U.S. Application Data

(60) Provisional application No. 63/315,079, filed on Feb. 28, 2022.

(51) Int. Cl.
*H10F 77/14* (2025.01)
*H10F 71/00* (2025.01)

(52) U.S. Cl.
CPC ....... *H10F 77/1437* (2025.01); *H10F 71/121* (2025.01)

(58) Field of Classification Search
None
See application file for complete search history.

(56) References Cited

U.S. PATENT DOCUMENTS

| | | | | |
|---|---|---|---|---|
| 2006/0057858 A1* | 3/2006 | Chung | ............. | H01L 21/02178 438/770 |
| 2012/0205635 A1* | 8/2012 | Baba | .................... | C07D 403/14 548/440 |
| 2012/0282721 A1* | 11/2012 | Liao | ........................ | C09D 11/52 257/E31.127 |
| 2022/0416107 A1* | 12/2022 | Yu | ........................ | H01L 31/0725 |
| 2023/0157049 A1* | 5/2023 | Zhang | .................. | C09K 11/565 257/40 |

* cited by examiner

*Primary Examiner* — Hsien Ming Lee

(57) ABSTRACT

A photovoltaic structure includes: a hole-selective contact comprising an anodized aluminum layer overlaying a different electrode metal and a plurality of contact vias that extend through the anodized aluminum layer to the different electrode metal, wherein locations of the plurality of contact vias define an ordered array; an absorber comprising a chalcopyrite (Ag,Cu)(Ga,In)S,Se:Alk, where Alk represents at least one alkali element, the absorber comprising at least a residual of a contiguous nucleation template over the anodized aluminum layer; an electron-selective contact; and a plurality of nanorods located in the plurality of contact vias, the plurality of nanorods providing ohmic contacts between the hole-selective contact and the different electrode metal at their interface at a bottom of each contact via, and comprising at least a residual of at least one surfactant and at least a residual of at least one minority alloy constituent.

14 Claims, 7 Drawing Sheets

PHOTOELECTROCHEMICAL PROCESS INTENSIFICATION FOR SUSTAINABLE PHOTOVOLTAICS MANUFACTURING

CROSS-REFERENCE TO RELATED APPLICATION

Referring to the application data sheet filed herewith, this application claims a benefit of priority under 35 U.S.C. 119 (e) from provisional patent application U.S. Ser. No. 63/315,079, filed Feb. 28, 2022, the entire contents of which are hereby expressly incorporated herein by reference for all purposes.

BACKGROUND

Photovoltaic (PV) power conversion technologies are well underway towards disrupting the dominance of fossil fuels as civilization's primary energy source at the nexus of two inexorable trends: the declining cost of PV manufacturing and accelerating climate change. Numerous analyses have concluded that the swift electrification of our global energy infrastructure is the only viable pathway to arresting ecosystem devastation and inadequate economic growth to circumvent ensuing social instability and human suffering. Pv module manufacturing specific cost reduction (measured as $/W_p$) has been driven by a combination of increasing efficiency and product size pushing unit $W_p$ up and cost/unit reduction from aggregate experience curve effects such as increasing yield, production scale, and supply chain integration.

Pv systems' levelized-cost-of-electricity (LCOE) are no longer dominated by module cost but rather downstream installation labor and balance-of-system (BOS) hardware costs. This progress has fostered a sense of complacency amongst some that the challenges of PV module manufacturing in the multi-TW range required to electrify our global economy have already been solved so all that remains is to scale the currently dominant silicon wafer-based technology. This is naïve and incorrect, if understandable given the plethora of other climate challenges which seem less tractable and distract from less obvious systemic problems which will become significant as the PV manufacturing industry grows over coming decades. Those challenges stem from the combination of high silicon PV manufacturing supply chain capital and energy intensities. Our opportunity is to advance manufacturing technology for alternative PV materials and device technologies which have proven capable of comparable or superior performance to silicon and show clear potential for less capital-intensive manufacturing at scale with less embedded energy content. These innovations would provide a pathway to both reshoring PV manufacturing to the U.S. and ensuring the resilience of our initiatives to electrify the energy foundation of our nation's economic infrastructure.

Heretofore, the challenges of high silicon PV manufacturing supply chain capital and energy intensities referred to above have not been sufficiently addressed. In view of the foregoing, there is a need in the art for a solution that simultaneously overcomes both of these challenges.

SUMMARY

There is a need for the following embodiments of the present disclosure. Of course, the present disclosure is not limited to these embodiments.

According to an embodiment of the present disclosure, a process of making a photovoltaic structure comprises: depositing a substrate hole-selective contact multilayer metal comprising aluminum overlaying a different electrode metal; nanoprinting an etch barrier to define a pattern of at least one area for selective aluminum removal; selectively etching the top aluminum layer to define the contact vias; and then removing an etch barrier; selectively anodizing a top aluminum layer to form an alumina passivation/antireflection layer comprising the plurality of contact vias; depositing a hole transport layer/passivation plating/solution precursor into a plurality of contact vias; and then photochemical/thermal decomposition to form the plurality of nanorods; depositing a nucleation templating solution precursor onto a plurality of nanorods and a dielectric; and then photochemical/thermal decompositing the nucleation templating solution precursor; reactive codepositing an indium-gallium-selenide semiconductor alloy comprising reacting with nucleation layer/nanorods; depositing a copper/selenium metalorganic solution precursor; synthesizing an ACIGS absorber layer using rapid optical processing; depositing an electron transport layer using a metalorganic solution precursor comprising alkali/sulfur/selenium; synthesizing a hole-selective contact/absorber/electron-selective contact structure using rapid optical processing; alkali ion exchanging the hole-selective contact/absorber/electron-selective contact structure; and depositing a transparent conducting electrode on the alkali ion exchanged hole-selective contact/absorber/electron-selective contact structure.

According to another embodiment of the present disclosure, a photovoltaic structure comprises: a hole-selective contact comprising an anodized aluminum layer overlaying a different electrode metal and a plurality of contact vias that extend through the anodized aluminum layer to the different electrode metal, wherein locations of the plurality of contact vias define an ordered array; an absorber comprising a chalcopyrite (Ag,Cu) (Ga, In)S,Se:Alk, where Alk represents at least one alkali element, the absorber comprising at least a residual of a contiguous nucleation template over the anodized aluminum layer; an electron-selective contact; and a plurality of nanorods located in the plurality of contact vias, the plurality of nanorods providing ohmic contacts between the hole-selective contact and the different electrode metal at their interface at a bottom of each contact via, and comprising at least a residual of at least one surfactant and at least a residual of at least one minority alloy constituent.

These, and other, embodiments of the present disclosure will be better appreciated and understood when considered in conjunction with the following description and the accompanying drawings. It should be understood, however, that the following description, while indicating various embodiments of the present disclosure and numerous specific details thereof, is given for the purpose of illustration and does not imply limitation. Many substitutions, modifications, additions and/or rearrangements may be made within the scope of embodiments of the present disclosure, and embodiments of the present disclosure include all such substitutions, modifications, additions and/or rearrangements.

BRIEF DESCRIPTION OF THE DRAWINGS

The drawings accompanying and forming part of this specification are included to depict certain embodiments of the present disclosure. A clearer concept of the embodiments described in this application will be readily apparent by referring to the exemplary, and therefore nonlimiting, embodiments illustrated in the drawings. The described embodiments may be better understood by reference to one or more of these drawings in combination with the following description presented herein. It should be noted that the features illustrated in the drawings are not necessarily drawn to scale.

DETAILED DESCRIPTION

Figure 1A:
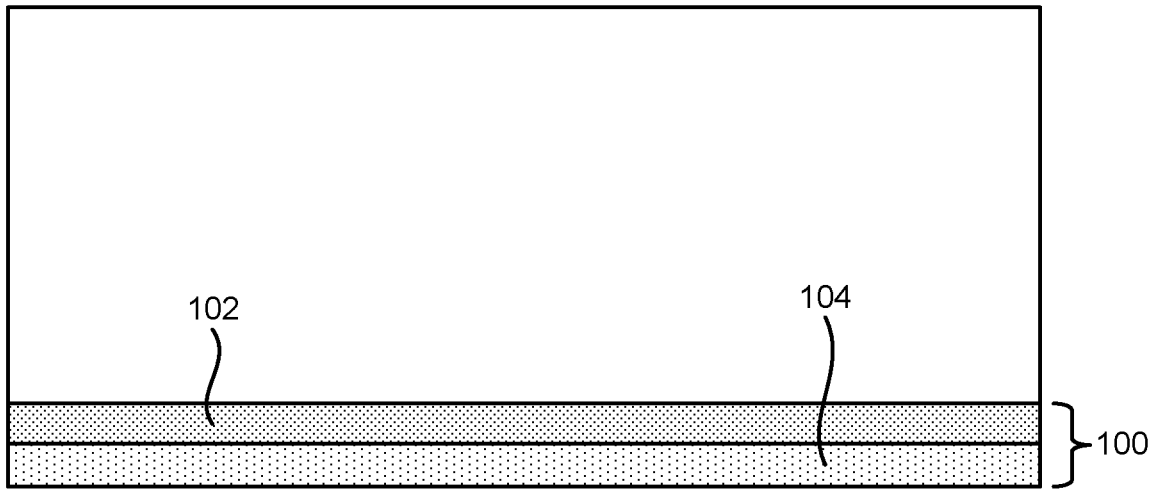
FIG. 1A is a schematic view of step 1 of a processing sequence providing a substrate HSC multilayer metal deposition with aluminum overlaying different electrode metal in accordance with an embodiment of the present disclosure.

Embodiments presented in the present disclosure and the various features and advantageous details thereof are explained more fully with reference to the nonlimiting embodiments that are illustrated in the accompanying drawings and detailed in the following description. Descriptions of well-known materials, techniques, components and equipment are omitted so as not to unnecessarily obscure the embodiments of the present disclosure in detail. It should be understood, however, that the detailed description and the specific examples are given by way of illustration only and not by way of limitation. Various substitutions, modifications, additions and/or rearrangements within the scope of the underlying inventive concept will become apparent to those skilled in the art from this disclosure.

In general, the context of an embodiment of the present disclosure can include manufacture of semiconductor alloys, superconductor alloys, or other multinary functional coatings. For example, the context of an embodiment of the present disclosure can include manufacture of the (Ag,Cu)(In,Ga)(S,Se) material system on substrates for solar photovoltaic modules.

Process intensification (PI) methodologies are characterized by four underlying principles which pertain across broad but distinctive temporal domains and at different length scales.

First, in the spatial domain at the shortest length scales PI seeks to maximize the effectiveness of inter- and intramolecular interactions, which may involve molecular reactant design and non-thermal reaction activation mechanisms such as photoexcitation or plasmas to reduce thermal budget.

Second, in the thermodynamic domain at length scales from nano- to micrometers PI seeks to create the same processing experience for each specie utilized in chemical reaction processing tools to improve yield. In chemical processing this often involves manipulating the reactor environment to increase surface/volume ratios for catalytic process activation using particles, films, and other coatings.

Third, in the macroscale functional design domain optimizes the driving forces and resistances for transport processes, for example assemblies of microporous membranes for multiscale channel flow hydrodynamic mixing to reduce the size and energy consumption of fluid processing tools.

Fourth, in the temporal domain PI seeks to fully leverage the benefits of the preceding optimization strategies by integrating multiple or partial processing steps into single tools to maximize synergies between them that can reduce processing time, thereby improving system and plant-wide throughput.

Taken together these process and tool optimization methodologies often yield smaller-scale modular processing systems with operational cost structures that permit cost-competitive, geographically distributed manufacturing. These advantages of the PI manufacturing technology development paradigm are thus especially valuable in commodity product manufacturing where logistics costs of either or both raw material and energy inputs or finished product delivery are a significant part of total product price. This context is obviously pertinent to the burgeoning TW-scale global market for solar PV power systems.

This disclosure describes an innovative hybrid processing approach for the production of CIS-alloy PV products to effectively implement this paradigm, thereby increasing their power conversion efficiency (PCE) while reducing embedded energy, manufacturing capital intensity, and competitive production scale. Embodiments of this disclosure offer a solution to the need and opportunity to further reduce the cost, manufacturing capital intensity, and supply chain risk for PV power systems, by applying the principles of PI to the manufacture of CIS-alloy devices for both single- and tandem-junction module architectures.

Hybrid Processing of Chalcopyrite Absorber Photovoltaics

CIS-based semiconductor alloys used as PV absorbers exhibit a chalcopyrite crystal structure, tetrahedrally-coordinated as are silicon, III-V's and CdTe, and also a superstructure of the zincblende crystal form characteristic of the latter two. They have a nominal stoichiometric composition of I-III-VI$_2$ with the Group I and III metal atoms on distinct cation sublattices, but unlike all the other semiconductors with high PV performance demonstrate an exceptionally wide range of compositional variability in the ratio of Group I to III atoms with little impact on their excess photocarrier recombination or transport properties so long as the chalcogen anion sublattice has few vacancies or planar stacking fault disruptions. Unlike CdTe whose phase diagram exhibits a temperature range wherein the solid phase sublimes molecularly (key to the efficacy of the commercially successful vapor transport deposition (VTD) process), none of the CIS-based I-III-VI compounds or their binary constituents evaporate congruently (a feature shared by the III-V binary phase systems), so active composition control and multisource deposition methods are conventionally utilized to grow thin absorber films via energy-intensive evaporation/condensation processes.

Two processing methods, known as chalcogenization and codeposition, have been utilized to make all of the record efficiency CIS-alloy devices, although many others have been investigated with less success. Chalcogenization is a multistep process wherein the metals are first deposited onto a substrate, typically using plasma sputtering, followed by annealing in a chalcogen hydride environment to react them and form the semiconductor film. Codeposition deposits the elemental metals and chalcogens concurrently, reacting as they adsorb or chemisorb on the substrate surface, most often using thermal evaporation of the elements, essentially molecular beam deposition sans epitaxy. Chalcogenization is relatively slow inasmuch as its second step is a diffusion-limited process, whereas achieving both large-area uniformity and high reactant utilization is challenging when evaporation is used to deliver the metals during codeposition. Both methods are typically implemented using tools and processes with relatively high thermal budgets compared to thin film optoelectronic structures used in other applications that require large area deposition such as flat-screen displays and low-emissivity window coatings.

FIGS. 1A-1L show an exemplary processing sequence in accordance with an embodiment of this disclosure. Of course, embodiments of the disclosure are not limited to this exemplary sequence, or the individual steps of this sequence, and include other sequences as well as other individual steps.

FIG. 1A illustrates substrate hole-selective contact multilayer metal deposition with a different electrode aluminum overlaying metal. The substrate 100 includes an aluminum layer 102 on a different metal layer 104.

Figure 1B:
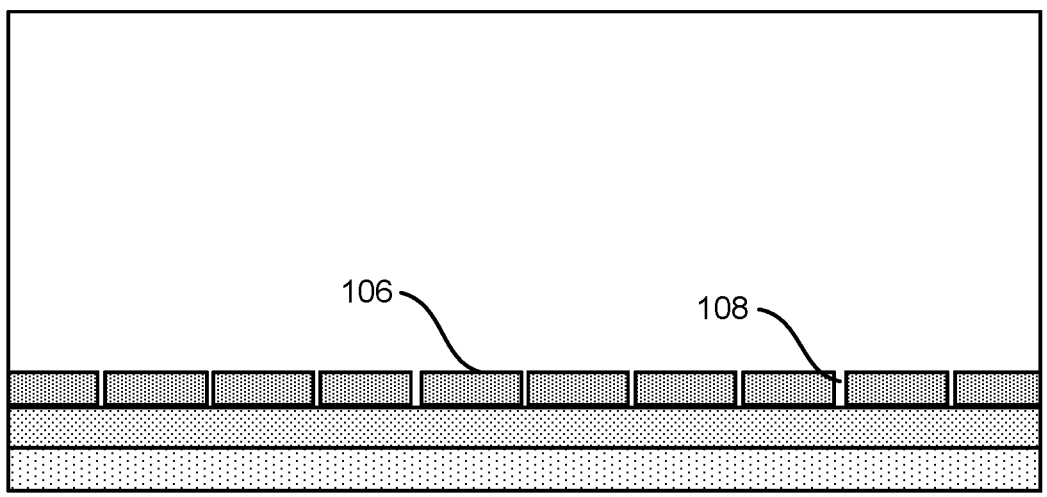
FIG. 1B is a schematic view of step 2 of a processing sequence providing a nanoprinted etch barrier to define optimized pattern of areas for selective Al removal in accordance with an embodiment of the present disclosure.

FIG. 1B illustrates a nanoprinted etch barrier to define an optimized pattern of areas for selective Al removal. The etch barrier 106 includes a plurality of openings 108.

Figure 1C:
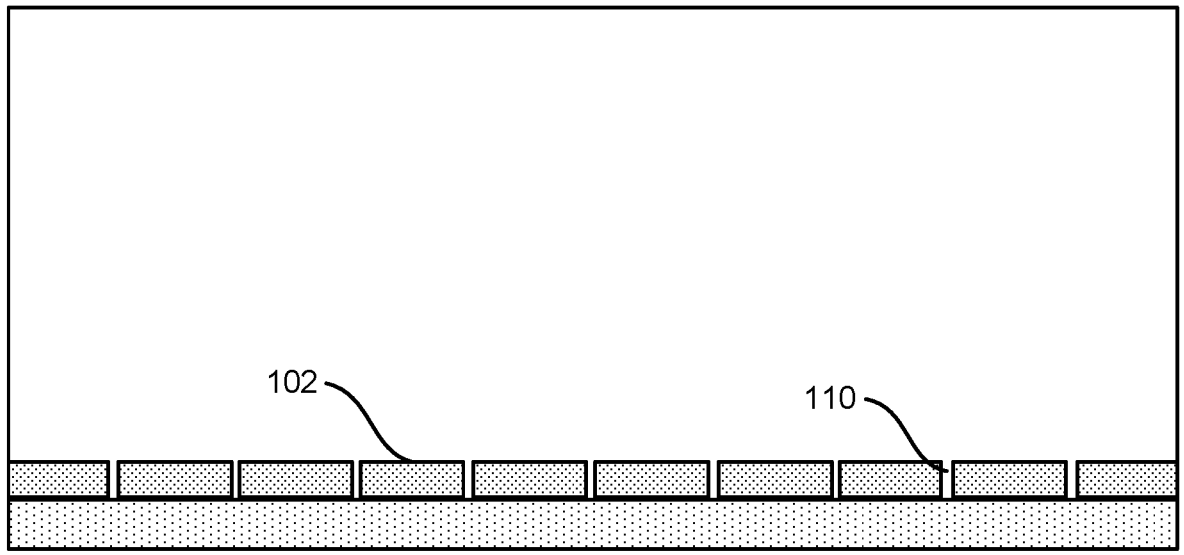
FIG. 1C is a schematic view of step 3 of a processing sequence providing a selective etching of top Al layer to define contact vias and removal of etch barrier in accordance with an embodiment of the present disclosure.

FIG. 1C illustrates selective etching of top Al layer to define contact vias and removal of the etch barrier. Aluminum layer 102 includes a plurality of vias 110.

Figure 1D:
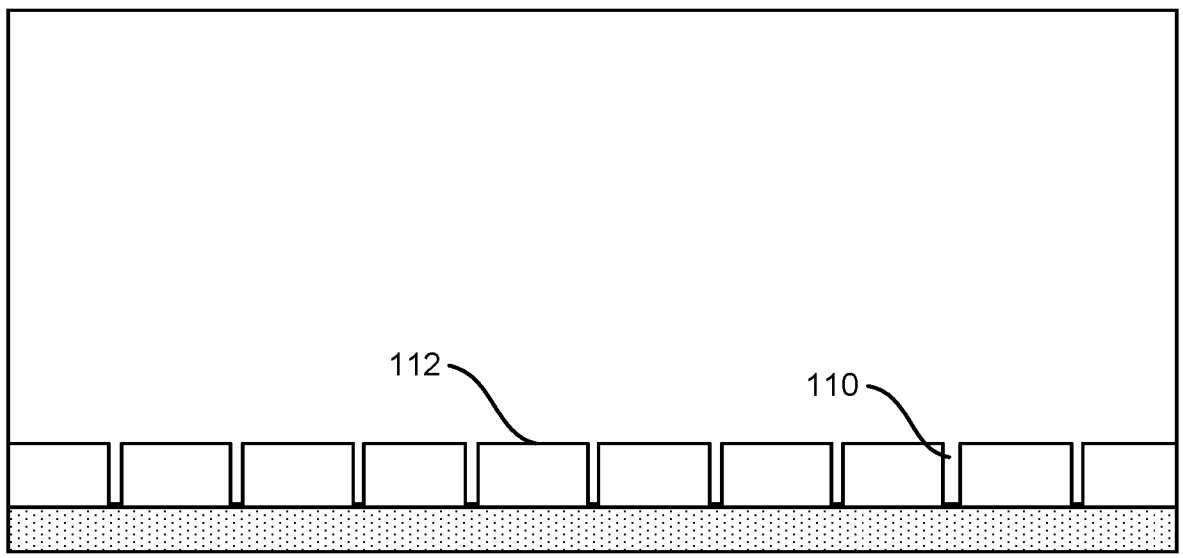
FIG. 1D is a schematic view of step 4 of a processing sequence providing a selective anodization of top Al layer to form alumina passivation/antireflection layer w/vias in accordance with an embodiment of the present disclosure.

FIG. 1D illustrates selective anodization of a top of the aluminum layer to form an alumina passivation/antireflection layer including vias. The alumina passivation/antireflection layer 112 includes the plurality of vias 110.

Figure 1E:
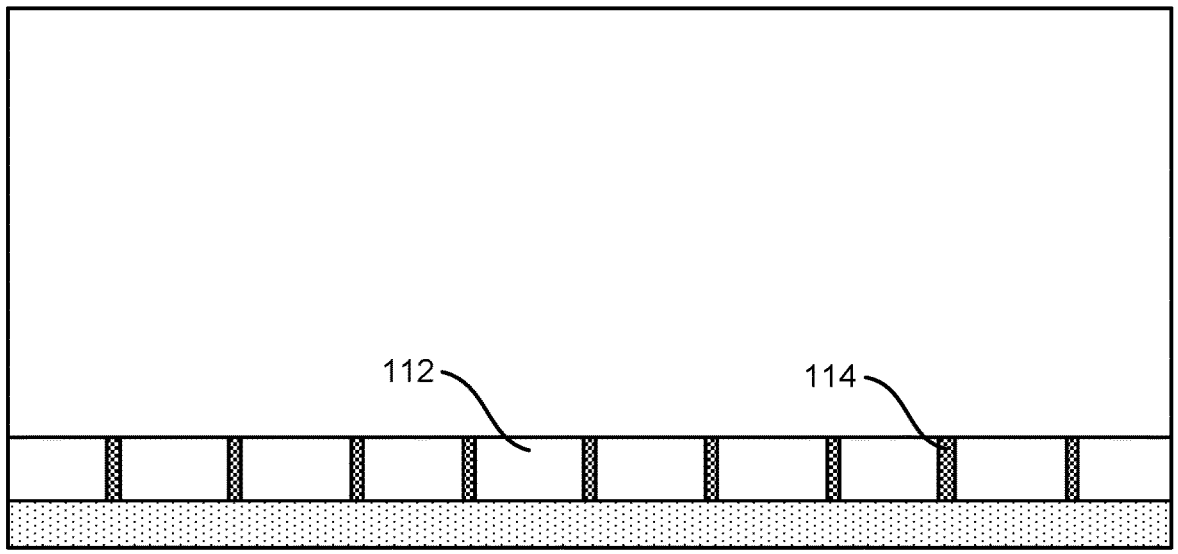
FIG. 1E is a schematic view of step 5 of a processing sequence providing a HTL/passivation plating/solution precursor deposition into nanopores and photochemical/thermal decomposition to form nanorods in accordance with an embodiment of the present disclosure.

FIG. 1E illustrates HTL/passivation plating/solution precursor deposition into nanopores and photochemical/thermal decomposition to form nanorods. The nanopores include plurality of vias 110 but can also include other features in the alumina passivation/antireflection layer 112 at other locations. The alumina passivation/antireflection layer 112 includes a plurality of nanorods 114.

Figure 1F:
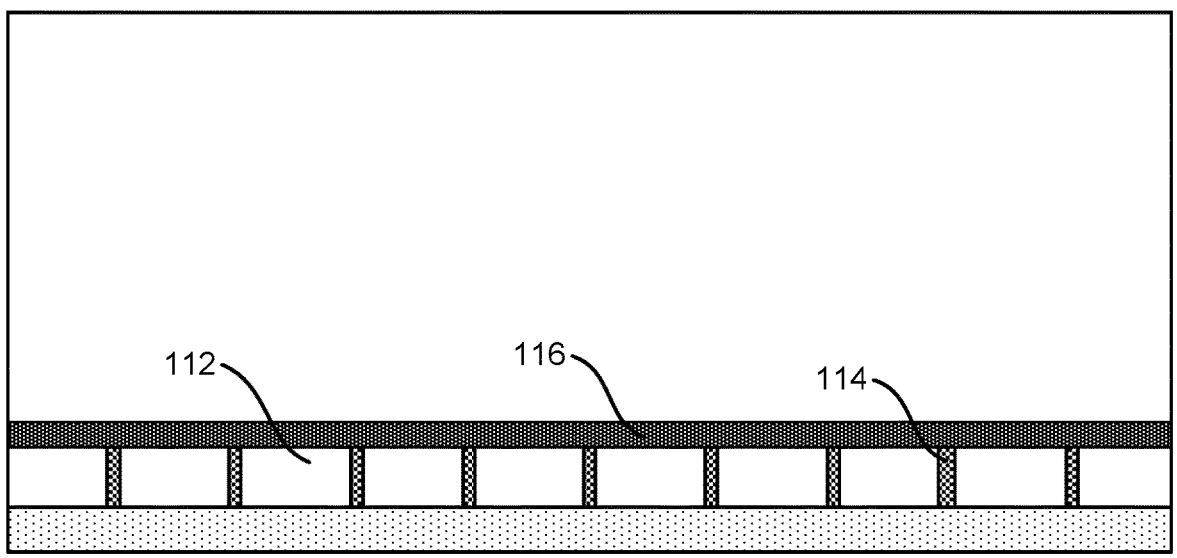
FIG. 1F is a schematic view of step 6 of a processing sequence providing a nucleation templating solution precursor deposition onto nanorods and dielectric then photochemical/thermal decomposition in accordance with an embodiment of the present disclosure.

FIG. 1F illustrates nucleation templating solution precursor deposition onto nanorods and dielectric then photochemical/thermal decomposition. Nucleation layer 116 is located on top of alumina passivation/antireflection layer 112 and plurality of nanorods 114.

Figure 1G:
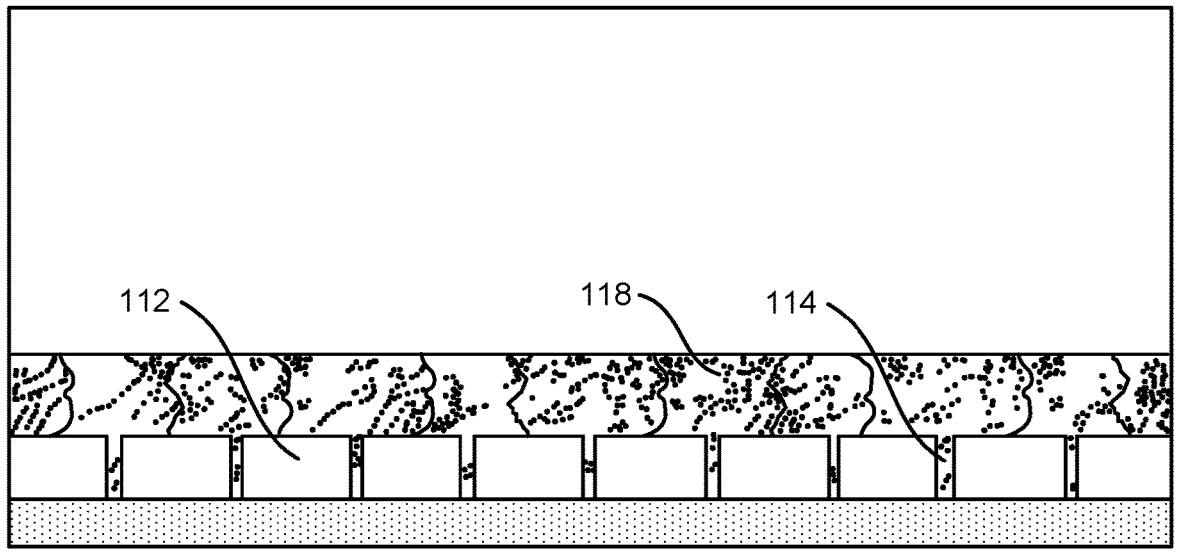
FIG. 1G is a schematic view of step 7 of a processing sequence providing a reactive codeposition of indium-gallium-selenide semiconductor alloy and reaction with nucleation layer/nanorods in accordance with an embodiment of the present disclosure.

FIG. 1G illustrates reactive codeposition of indium-gallium-selenide semiconductor alloy and reaction with nucleation layer/nanorods. Reaction layer 118 is located on top of alumina passivation/antireflection layer 112 and plurality of nanorods 114.

Figure 1H:
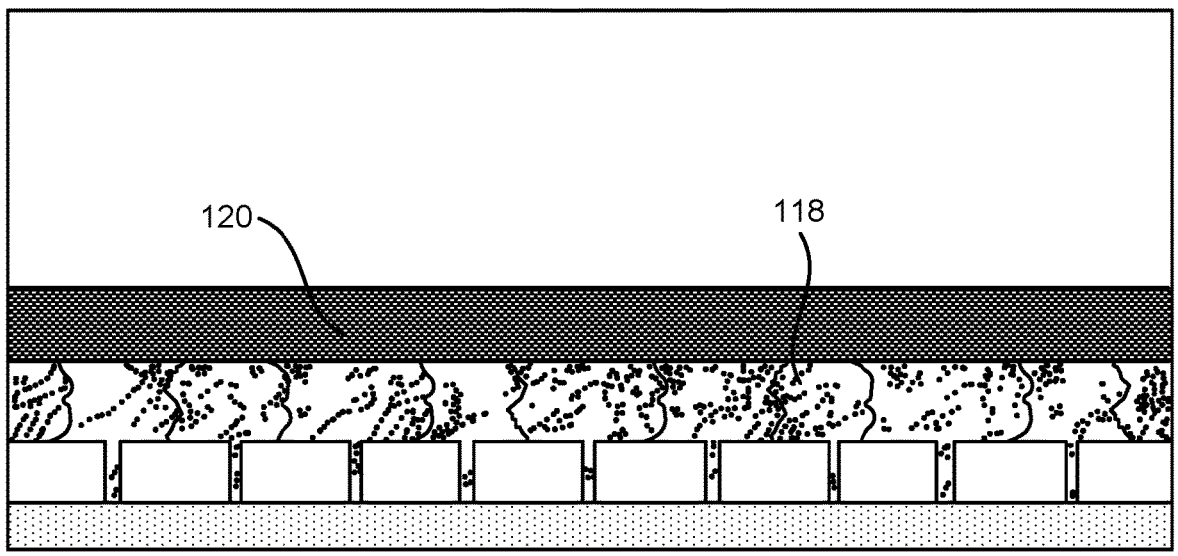
FIG. 1H is a schematic view of step 8 of a processing sequence providing a copper/selenium metalorganic solution precursor deposition in accordance with an embodiment of the present disclosure.

FIG. 1H illustrates copper/selenium metalorganic solution precursor deposition. Copper/selenium metalorganic solution precursor layer 120 is located on top of reaction layer 118.

Figure 1I:
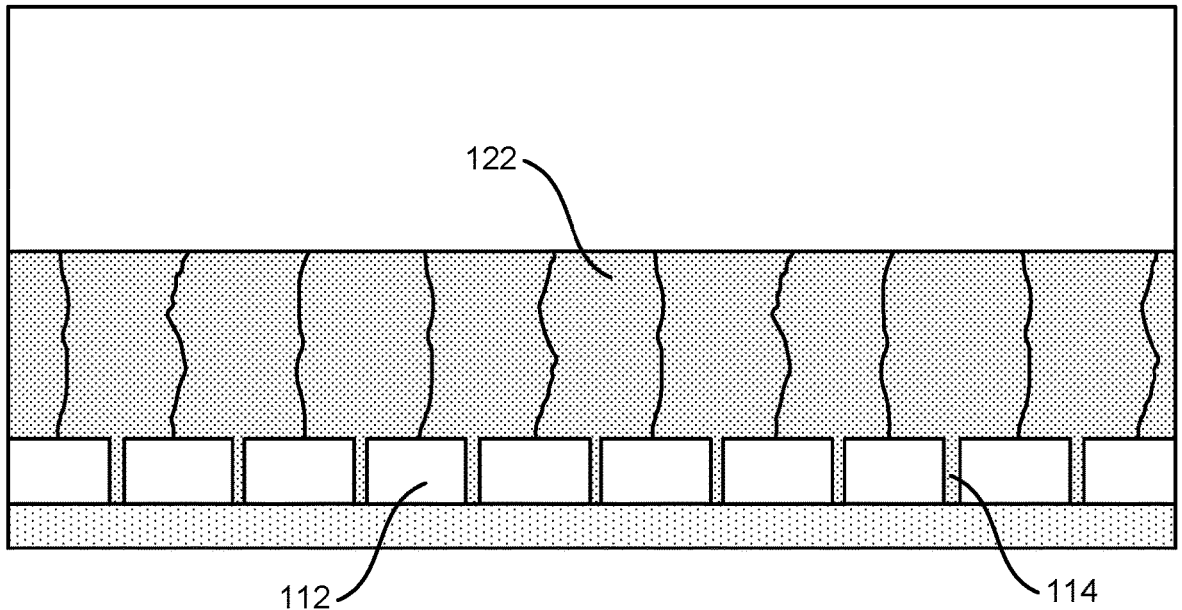
FIG. 1I is a schematic view of step 9 of a processing sequence providing a rapid optical processing (ROP) to synthesize ACIGS absorber layer in accordance with an embodiment of the present disclosure.

FIG. 1I illustrates rapid optical processing (ROP) to synthesize an ACIGS absorber layer. ACIGS absorber layer 122 is located on top of alumina passivation/antireflection layer 112 and plurality of nanorods 114.

Figure 1J:
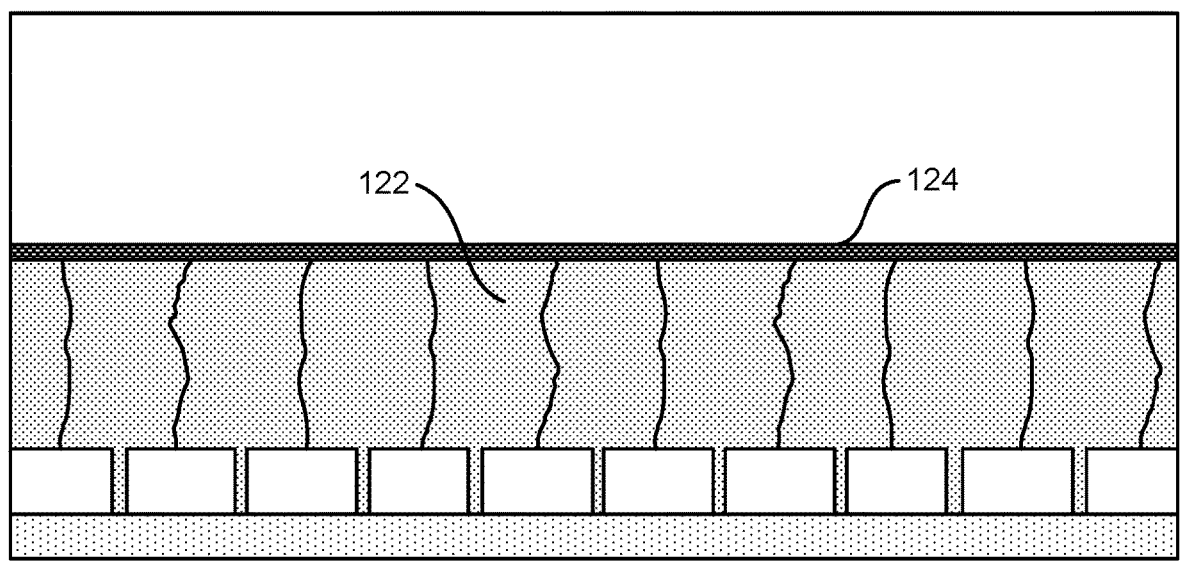
FIG. 1J is a schematic view of step 10 of a processing sequence providing a ETL metalorganic solution precursor deposition containing alkali/sulfur/selenium in accordance with an embodiment of the present disclosure.

FIG. 1J illustrates electron transport layer (ETL) metalorganic solution precursor deposition containing alkali/sulfur/selenium. Electron transport layer metalorganic solution precursor layer 124 is located on top of ACIGS absorber layer 122.

Figure 1K:
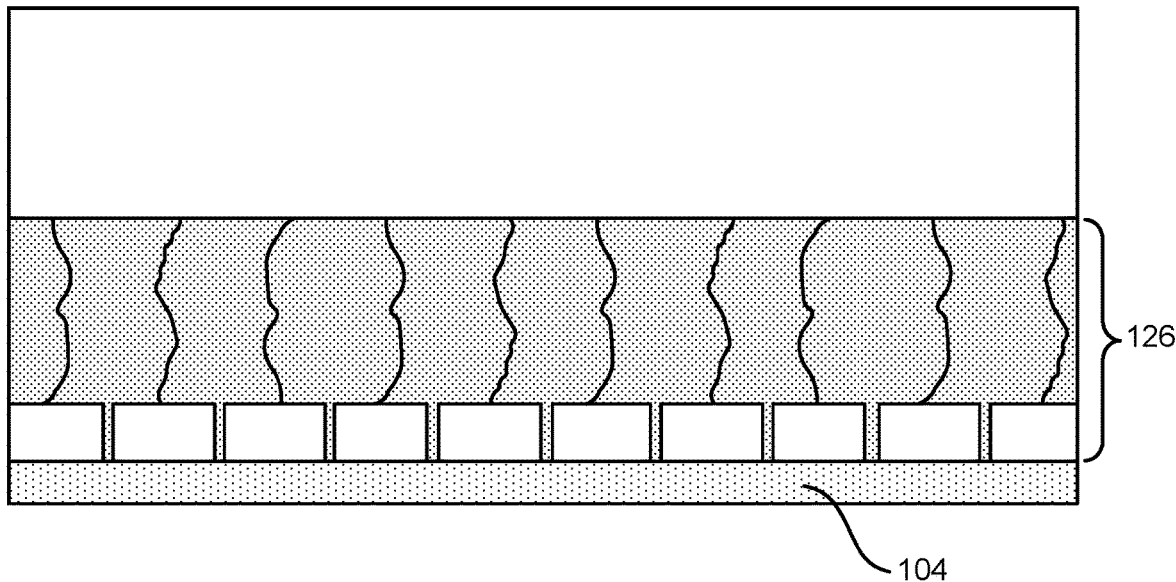
FIG. 1K is a schematic view of step 11 of a processing sequence providing a rapid optical processing (ROP) to synthesize HSC/absorber/ESC structure in accordance with an embodiment of the present disclosure.

FIG. 1K illustrates rapid optical processing (ROP) to synthesize a hole-selective carrier/absorber/electron-selective contact structure. Hole-selective carrier/absorber/electron-selective contact structure 126 is located on top of different metal layer 104.

FIG. 1J illustrates alkali post-deposition ion exchange and transparent conducting electrode deposition. Transparent conducting electrode 128 is located on hole-selective carrier/absorber/electron-selective contact structure 126.

Figure 2:
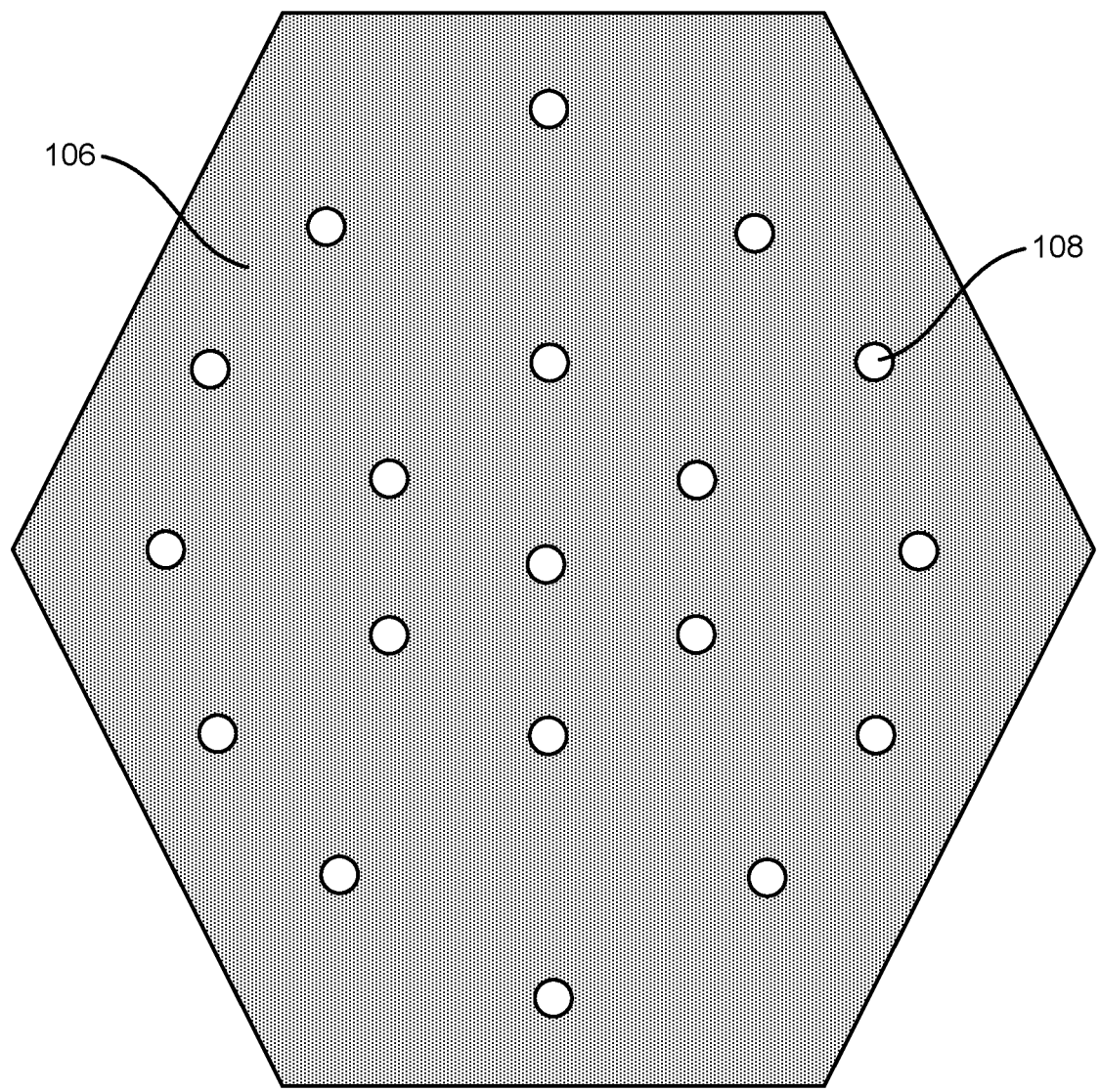
FIG. 2 is a schematic view of an exemplary nanopore pattern to nucleate a hexagonal array of grains with maximal volume/boundary area in accordance with an embodiment of the present disclosure.

FIG. 2 shows an exemplary nanopore pattern to nucleate a hexagonal array of grains with maximal volume/boundary area in accordance with an embodiment of this disclosure. Of course, embodiments of this disclosure are not limited to this pattern and include other patterns with high volume per boundary area.

Etch barrier 106 includes plurality of openings 108. Plurality of openings 108 mark the locations of a plurality of contact vias that will define an ordered array.

An important element of embodiments of this disclosure for processing the tri-layer semiconductor absorber in this device structure is to integrate crystallographically coherent multinary CIS-alloy hole-selective contact (HSC) and electron-selective contact (ESC) interfaces into an otherwise compositionally uniform solar absorber film using a multi-step hybrid method of depositing these carrier transport functional interface layers using solution precursor reaction or electroplating methods, both in the first sequence of steps onto a dielectric with nanopores (FIGS. 1A-1D, steps 1-4) to form a passivated emitter rear contact (PERC-structured) HSC (FIGS. 1E-1F, steps 5-6) and in the third sequence of steps onto a thicker CIS-alloy layer to form the ESC (FIGS. 1J-1K, steps 10-11). Solution processing may also be used in the second sequence of steps to intensify conventional CIS-alloy reactive elemental codeposition by using evaporated precursors only for the first stage (FIG. 1G, step 7) providing the III-VI constituents, with solution deposition replacing thermal evaporation of the I-VI constituents in the second stage (FIG.

1H, step 8). Subsequent photothermal annealing using the rapid optical processing (ROP) technique will be used to directly irradiate only the film side and synthesize the ternary semiconductor alloy (FIG. 1I, step 9), further minimizing overall thermal budget. These solution processing steps may be activated by photochemically-accelerated reactant decomposition methods, specifically in the case of the HSC PERC layer intensified using wavelength-selective plasmonic coupling to polaritons within the dielectric's nanopores.

Device Structure for Power Conversion Efficiency and Embedded Energy Co-Optimization There is another deleterious consequence of conventional CIGS processing method's characteristically high thermal budget which the research community has only recently recognized and begun to address as an obstacle to higher PCE: reduced quasi-Fermi level splitting (QFLS) due to excessive interdiffusion of gallium and indium creating $\mu$m-range bandgap gradients that reduce the external electrochemical potential between these photodiodes' contacts. This issue was highlighted in a recent review article of CIS-alloy PV technology, which advocates an optimal device structure paradigm already implemented in record PCE PV devices based on other materials systems, which seek to synthesize isotropic absorber layers bounded by passivated, carrier-selective contacts.

All prior world record CIS-alloy devices have used absorbers in the range of 2-3 $\mu$m thick, although the great majority of photogeneration occurs within the first 1.5 $\mu$m of the front ESC given the extremely high absorption coefficient of these materials ($>10^5$ cm$^{-1}$ in the visible). The contribution to PCE of this extra thickness adjacent the back contact is to host a gallium gradient that creates an internal field functioning to minimize the flux of electrons diffusing to the Mo/MoSe$_2$ HSC, thereby mitigating the impacts of its high interfacial recombination velocity and poor IR reflectivity at the cost of lost QFLS and thus operating voltage.

Analogous issues, albeit on different length scales, have driven the evolution of silicon solar cells away from alloyed aluminum screen-printed and fired rear contacts over the full backside of each wafer, which dominated the commercial PV market for decades until recently, to a variety of other contact structures utilizing a passivated rear surface with contact apertures. The most prevalent of these solutions to the problem of high recombination at the back contact of silicon cells is the passivated emitter rear contact (PERC), which has been emulated in a great deal of CIGS research over the last five years with promising results, enabling new record PCE for sub-micron CIGS thicknesses. The impact of reducing absorber thickness on the capital cost of deposition and selenization tools in CIGS manufacturing is dramatic, and it is this factor that dominates CIGS cost-of-goods-sold (COGS). Halving deposition time and minimizing substrate heating would also significantly reduce the embedded energy content of CIGS modules.

We detail in the following subsections the methods and materials that embodiments of this disclosure can employ to pioneer scalable intensified manufacturing processes for the fabrication of PV device structures providing light trapping and incorporating passivated carrier-selective contacts with CIS-alloy absorber layers integrally incorporating ultra-thin electron and hole transport layers (ETL and HTL respectively), utilizing the process flow sequence outlined in FIGS. 1A-1L.

Hole-Selective Contact Design and Processing

Cost-effective processing of dielectric passivation layers with the high density and small size of contact apertures required for direct-bandgap semiconductors with limited photocarrier diffusion lengths are on the same scale as the average grain size in most state-of-the-art CIGS absorbers, and not accessible using the laser ablation methods employed in PERC processing, so an innovative approach is needed. Embodiments of this disclosure can fabricate ordered arrays of apertures (e.g.: FIG. 1B, step 2) in dielectric passivation layers on reflective metallic contacts using anodization of metallic overlayers (FIGS. 1A-1D, steps 1-4), combined with nanoimprint lithography to form spatial distributions of nanopores optimized both to provide electrical contacts and a source of surfactants and minority alloy constituents to promote the annihilation and passivation of deleterious defects during the HSC/absorber synthesis and integration steps (FIGS. 1E-1J, steps 5-10). Passivating and minimizing the grain boundary interfacial surface area within the absorber, the dominant recombination mechanism in current record CIGS photovoltaic devices, will improve performance.

Optical Absorber Hybrid Processing and Functional Property Optimization

Subsequently plating and/or depositing designed molecular organometallic precursor solutions and using optical bond scission techniques, potentially delivered using highly energy-efficient LED's tuned to the relevant absorption wavelengths (FIGS. 1E-1F, steps 5-6), one goal of embodiments of this disclosure is to optimize the resulting multinary alloy composition and structure to simultaneously achieve two goals. First, to form Ohmic contacts between this hole transport layer (HTL) and the underlying metallic contact structure at their interface at the bottom of each aperture. Second, to form a thin (<100 nm) contiguous, large-grain nucleation template over the dielectric (FIG. 1F, step 6) for the subsequent growth of the bulk of the CIS-alloy absorber using a hybrid process (FIGS. 1G-1I, steps 7-9) combining traditional reactive codeposition of evaporated elemental precursors and solution deposition, followed by rapid optical processing (ROP). Preferred embodiments can be identified without undue experimentation by systematically exploring various compositions in the (Ag,Cu)(Ga,In)S,Se: Alk alloy domain (where Alk represents alkali elements) and the use of ROP to heat and recrystallize this HTL in a controlled vapor ambient.

Both the contact aperture spacing and dual-function HTL/nucleation layer processing may be co-optimized to translate the aperture spacing into grain size in the nucleation layer, essentially providing each grain an individual HSC array. Processing CIS synthesized using liquid precursors reactively transformed in a high-fugacity selenium environment by the FASST© process intensification method enables growth of grain size with micron-scale coatings thickness of these materials up to 200 $\mu$m in diameter. Increased grain size beyond that characteristic of current state-of-the-art CIS devices to reduce grain boundary recombination has been recently assessed a key requirement to further improve their PCE.

Electron-Selective Contact Design and Processing

The current record PCE CIS-alloy devices incorporate sulfur in the interfacial region to synthesize a copper-indium-sulfoselenide (CISS) absorber adjacent the junction using a sulfurization-after-selenization variant of the chalcogenization method, thereby alloying the absorber surface in a crystallographically-coherent manner to increase bandgap while optimizing band-bending and electron affinity. However, this diffusion-mediated anion exchange process is slow, contributing further to the high capital intensity of that method, which recently led the world's only manufacturer employing this approach to cease production. Embodiments of this disclosure can include circumventing these limitations by utilizing metalorganic solution precursors with rapid optical processing to dramatically accelerate synthesis of this sulfur-alloyed interfacial structure (FIGS. 1J-1K, steps 10-11). By doing so having supplied excess (Cu,Se) in the preceding process step 9 (FIG. 1I), the codeposited indium selenide base layer incorporating Ag from the nucleation layer will be fully converted into chalcopyrite silver/copper indium selenide (ACIGS) with a crystallographically-coherent $Cu_{2-x}Se$ terminal epilayer remaining, which can then be topotactically transformed into CISS by this method (e.g. by the steps shown in FIGS. 1J-1K, steps 10-11).

The significant reduction in overall thermal budget enabled by the ROP method employed throughout this innovative absorber/contact processing sequence offers a significant advantage over conventional methods by limiting the length-scale of interdiffusion between the carrier-selective contact regions and the bulk of the absorber. This offers two advantages over conventional approaches: synthesis of a more compositionally-homogeneous absorber to maximize QFLS as previously described; and greater control of interdiffusion which might result in the formation of defects from the interaction of HSC and ESC constituent elements, thereby expanding the range of elemental constituents available to optimize each.

Post-Deposition Alkali Exchange and Transparent Electrode Deposition

Figure 1L:
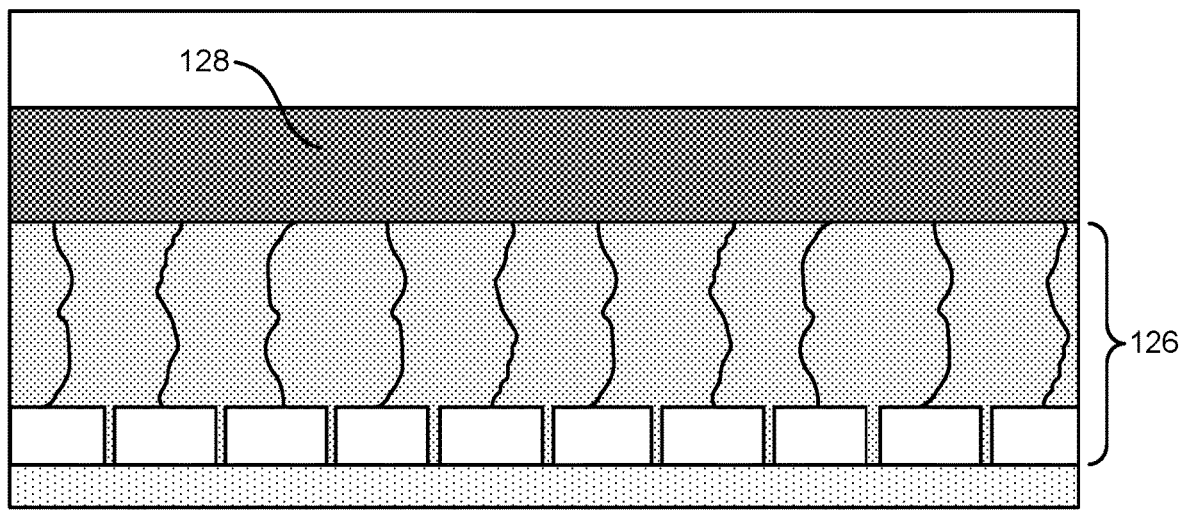
FIG. 1L is a schematic view of step 12 of a processing sequence providing an alkali post-deposition ion exchange and transparent conducting electrode deposition in accordance with an embodiment of the present disclosure.

FIG. 1L (step 12) illustrates providing alkali post-deposition ion exchange and transparent conducting electrode deposition in accord with an embodiment of this disclosure. The transparent conducting electrode is deposited after the alkali post-deposition ion exchange.

An embodiment of the present disclosure can also utilize data processing methods that transform signals from sensors and/or transducers to machine control signals. For example, an embodiment of the present disclosure can be combined with instrumentation to obtain state variable information to actuate interconnected discrete hardware elements. For instance, an embodiment of the present disclosure can include the use of temperature data to control machine configuration and/or operational parameters.

Practical Applications

A practical application of an embodiment of the present disclosure that has value within the technological arts is manufacture of thin film devices. Further, an embodiment of the present disclosure is useful in conjunction with fabrication of the CIS material system (that is used for the purpose of generating electricity), or in conjunction with fabrication of super conductors (such as are used for the purpose of conducting electricity with no resistance), or the like. There are virtually innumerable uses for embodiments of the present disclosure, all of which need not be detailed here.

Definitions

The term ordered array is intended to mean a periodic pattern (e.g. unit cell and/or space group) that may include rotational symmetry, defined by locations of a plurality of contact vias. The term spatially translates is intended to mean an ordered array is propagated during fabrication into grain location and/or size in the absorber. Optionally, each grain in the absorber spatially corresponds to an individual hole-selective contact array. The term hole-selective contact array is intended to mean a (sub-) set of nanorods that are located in the plurality of contact vias that function as ohmic contacts within a hole-selective layer. The term compound is intended to mean a substance formed when two or more chemical elements are chemically bonded together, the elements present in ratios with a limited range of variation and characteristic crystal structure.

The term phase is intended to mean a limited range of compositions of a mixture of the elements (in a thermochemical system) throughout which the chemical potential of the mixture varies with composition, and which either changes discontinuously or remains constant outside of that range. The phrase cation content is intended to mean the percentage or relative amount of a given cation of interest (relative to total number of atoms) in a given volume or mass of interest. The selenium atoms are not cations, they are technically anions and cation content is normalized to the total number of atoms in the film per unity volume. The term absorber is intended to mean the photon absorbing portion of a photovoltaic device which can generate current in operation. Other parts of the cell also absorb light but if they cannot generate current this is called "parasitic absorption". The term buffer is intended to mean the junction forming region of a photovoltaic. The term emitter is intended to mean the negative contact of an illuminated photovoltaic without current flow. The term amorphous transparent conductive layer is intended to mean a non-crystalline, substantially photon transparent, electronically conducting portion of a photovoltaic. The term back contact is intended to mean the contact of a photovoltaic on the side opposite the incident illumination. The term photovoltaic is intended to mean an article of manufacture for the generation of a voltage when radiant energy falls on the boundary between dissimilar substances (as two different semiconductors).

The term uniformly is intended to mean unvarying or deviating very little from a given and/or expected value (e.g, within 10% of). The term substantially is intended to mean largely but not necessarily wholly that which is specified. The term approximately is intended to mean at least close to a given value (e.g., within 10% of). The term generally is intended to mean at least approaching a given state. The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved. The term distal, as used herein, is intended to mean far, away, spaced apart from and/or non-coincident, and includes spatial situation where specified functions and/or results (if any) can be carried out and/or achieved. The term deploying is intended to mean designing, building, shipping, installing and/or operating.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or. Specifically, a condition A or B is satisfied by any one of the following: A is true (or present) and B is false (or not present), A is false (or not present) and B is true (or present), and both A and B are true (or present). The terms a and/or an are employed for grammatical style and merely for convenience.

The term plurality is intended to mean two or more than two. The term any is intended to mean all applicable members of a set or at least a subset of all applicable members of the set. The phrase any integer derivable therein is intended to mean an integer between the corresponding numbers recited in the specification. The phrase any range derivable therein is intended to mean any range within such corresponding numbers. The term means, when followed by the term "for" is intended to mean hardware, firmware and/or software for achieving a result. The term step, when followed by the term "for" is intended to mean a (sub) method, (sub) process and/or (sub) routine for achieving the recited result. Unless otherwise defined, all technical and scientific terms used herein have the same meaning as commonly understood by one of ordinary skill in the art to which this present disclosure belongs. In case of conflict, the present specification, including definitions, will control.

The described embodiments and examples are illustrative only and not intended to be limiting. Although embodiments of the present disclosure can be implemented separately, embodiments of the present disclosure may be integrated into the system(s) with which they are associated. All the embodiments of the present disclosure disclosed herein can be made and used without undue experimentation in light of the disclosure. Embodiments of the present disclosure are not limited by theoretical statements (if any) recited herein. The individual steps of embodiments of the present disclosure need not be performed in the disclosed manner, or combined in the disclosed sequences, but may be performed in any and all manner and/or combined in any and all sequences. The individual components of embodiments of the present disclosure need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials. Homologous replacements may be substituted for the substances described herein. Agents which are chemically related may be substituted for the agents described herein where the same or similar results would be achieved.

Various substitutions, modifications, additions and/or rearrangements of the features of embodiments of the present disclosure may be made without deviating from the scope of the underlying inventive concept. All the disclosed elements and features of each disclosed embodiment can be combined with, or substituted for, the disclosed elements and features of every other disclosed embodiment except where such elements or features are mutually exclusive. The scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" or "mechanism for" or "step for". Sub-generic embodiments of this disclosure are delineated by the appended independent claims and their equivalents. Specific embodiments of this disclosure are differentiated by the appended dependent claims and their equivalents.

What is claimed is:

1. A method, comprising:
   depositing an electron transport layer using a metalorganic solution precursor comprising alkali/sulfur/selenium;
   synthesizing a hole-selective contact/absorber/electron-selective contact structure using rapid optical processing; and
   before depositing the electron transport layer, synthesizing a chalcopyrite silver/copper indium selenide (ACIGS) absorber layer using rapid optical processing.

2. The method of claim 1, further comprising, before synthesizing the ACIGS absorber layer, depositing a copper/selenium metalorganic solution precursor.

3. The method of claim 2, further comprising, before depositing the copper/selenium metalorganic solution precursor, reactive codepositing an indium-gallium-selenide semiconductor alloy comprising reacting with nucleation layer/nanorods.

4. The method of claim 3, further comprising, before reactive codepositing, depositing a nucleation templating solution precursor onto a plurality of nanorods and a dielectric; and then photochemical/thermal decompositing the nucleation templating solution precursor.

5. The method of claim 4, further comprising, before depositing the nucleation templating solution precursor, depositing a hole transport layer/passivation plating/solution precursor into a plurality of contact vias; and then photochemical/thermal decomposition to form the plurality of nanorods.

6. The method of claim 5, further comprising, before depositing the hole transport layer/passivation plating solution precursor, selectively anodizing a top aluminum layer to form an alumina passivation/antireflection layer comprising the plurality of contact vias.

7. The method of claim 6, further comprising, before selectively anodizing, selectively etching the top aluminum layer to define the contact vias; and then removing an etch barrier.

8. The method of claim 7, further comprising, before selectively etching the top aluminum layer, nanoprinting the etch barrier to define a pattern of at least one area for selective aluminum removal.

9. The method of claim 8, further comprising, before nanoprinting the etch barrier, depositing a substrate hole-selective contact multilayer metal comprising aluminum overlaying an electrode metal.

10. A photovoltaic structure made in accordance with the method of claim 1.

11. A method, comprising:
    depositing an electron transport layer using a metalorganic solution precursor comprising alkali/sulfur/selenium;
    synthesizing a hole-selective contact/absorber/electron-selective contact structure using rapid optical processing; and
    after synthesizing the hole-selective contact/absorber/electron-selective contact structure, alkali ion exchanging the hole-selective contact/absorber/electron-selective contact structure.

12. The method of claim 11, further comprising depositing a transparent conducting electrode on the alkali ion exchanged hole-selective contact/absorber/electron-selective contact structure.

13. An assembly, comprising a photovoltaic structure made in accordance with the method of claim 11.

14. A method, comprising:
    depositing a substrate hole-selective contact multilayer metal comprising an aluminum layer overlaying an electrode metal;
    nanoprinting an etch barrier to define a pattern of at least one area for selective aluminum removal;
    selectively etching the aluminum layer to define a plurality of contact vias; and then removing an etch barrier;

selectively anodizing the aluminum layer to form an alumina passivation/antireflection layer comprising the plurality of contact vias;

depositing a hole transport layer/passivation plating/solution precursor into the plurality of contact vias; and then photochemical/thermal decomposition to form a plurality of nanorods;

depositing a nucleation templating solution precursor onto the plurality of nanorods and a dielectric; and then photochemical/thermal decompositing the nucleation templating solution precursor;

reactive codepositing an indium-gallium-selenide semiconductor alloy comprising reacting with nucleation layer/nanorods;

depositing a copper/selenium metalorganic solution precursor;

synthesizing a chalcopyrite silver/copper indium selenide (ACIGS) absorber layer using rapid optical processing;

depositing an electron transport layer using a metalorganic solution precursor comprising alkali/sulfur/selenium;

synthesizing a hole-selective contact/absorber/electron-selective contact structure using rapid optical processing;

alkali ion exchanging the hole-selective contact/absorber/electron-selective contact structure; and depositing a transparent conducting electrode on the alkali ion exchanged hole-selective contact/absorber/electron-selective contact structure.

* * * * *